US010448519B2

United States Patent
Su et al.

(10) Patent No.: US 10,448,519 B2
(45) Date of Patent: Oct. 15, 2019

(54) METHOD OF MASKING AND DE-MASKING

(71) Applicant: HZO, Inc., Draper, UT (US)

(72) Inventors: Joshua Su, Draper, UT (US); Yang Yun, Draper, UT (US); Howard Liu, Draper, UT (US)

(73) Assignee: HZO, INC., Draper, UT (US)

( * ) Notice: Subject to any disclaimer, the term of this patent is extended or adjusted under 35 U.S.C. 154(b) by 0 days.

(21) Appl. No.: 15/641,138

(22) Filed: Jul. 3, 2017

(65) Prior Publication Data

US 2018/0177062 A1    Jun. 21, 2018

Related U.S. Application Data

(60) Provisional application No. 62/357,877, filed on Jul. 1, 2016.

(51) Int. Cl.
| | |
|---|---|
| *H05K 3/46* | (2006.01) |
| *H05K 3/00* | (2006.01) |
| *B05D 1/32* | (2006.01) |
| *H05K 3/28* | (2006.01) |

(52) U.S. Cl.
CPC ......... *H05K 3/4644* (2013.01); *H05K 3/0044* (2013.01); *H05K 3/0079* (2013.01); *H05K 3/28* (2013.01); *B05D 1/322* (2013.01); *B05D 2252/10* (2013.01); *H05K 2203/0195* (2013.01); *H05K 2203/0228* (2013.01); *H05K 2203/0548* (2013.01); *H05K 2203/1383* (2013.01)

(58) Field of Classification Search
CPC ............................. B05B 12/20; B05C 21/005
See application file for complete search history.

(56) References Cited

U.S. PATENT DOCUMENTS

| | | | |
|---|---|---|---|
| 7,208,046 B1 * | 4/2007 | Anderson | B05B 13/0242 118/320 |
| 7,365,367 B2 | 4/2008 | Han et al. | |
| 9,162,243 B2 | 10/2015 | Pei et al. | |
| 2003/0060079 A1 * | 3/2003 | LePottier | H01R 13/645 439/492 |
| 2009/0181226 A1 | 7/2009 | Ning et al. | |

* cited by examiner

*Primary Examiner* — Xiao S Zhao
(74) *Attorney, Agent, or Firm* — Intellectual Strategies

(57) ABSTRACT

A method of masking a feature of a substrate using a fixture includes removably coupling a fixture to a first side of the feature of the substrate, the fixture including walls configured to abut sides of the feature and extend beyond a top surface of the feature when the fixture is removably coupled to the first side. The method further includes applying a masking material to the top surface of the feature. The method further includes removably coupling the fixture to a second side of the feature, the second side opposing the first side, the walls of the fixture configured to abut the sides of the feature and extend beyond a bottom surface of the feature when the fixture is removably coupled to the second side. The method further includes applying the masking material to the bottom surface of the feature while the fixture is removably coupled.

17 Claims, 7 Drawing Sheets

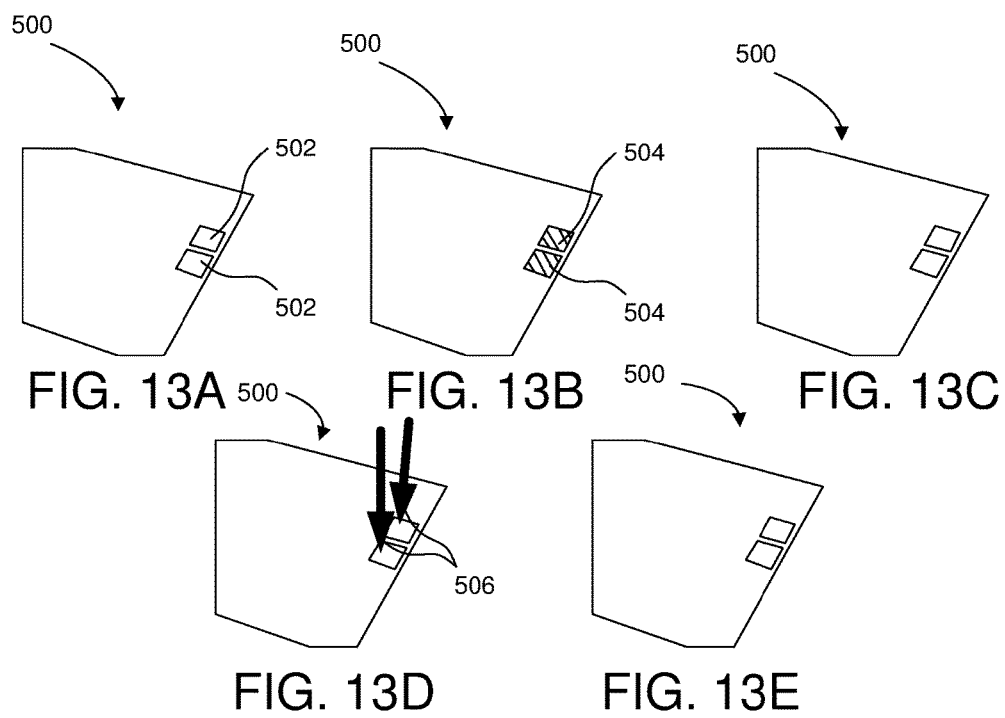

METHOD OF MASKING AND DE-MASKING

RELATED APPLICATIONS

This application claims priority to U.S. provisional application 62/357,877 entitled "Method of Masking and De-Masking" and filed on 1 Jul. 2016. The above application is incorporated herein by reference in its entirety.

BACKGROUND

This disclosure relates generally to methods and systems for applying masking materials to and removing masking materials from selected areas of substrates, such as electronic devices and subassemblies. More specifically, this disclosure relates to fixtures used in masking processes and sacrificial layers used in masking and de-masking processes for electronic devices.

SUMMARY

The subject matter of the present application has been developed in response to the present state of the art, and in particular, in response to the problems and disadvantages associated with masking and de-masking that have not yet been fully solved by currently available techniques. Accordingly, the subject matter of the present application has been developed to provide embodiments of a system, an apparatus, and a method that overcome at least some of the shortcomings of prior art techniques.

Embodiments of a method of masking a feature of a substrate using a fixture are disclosed. In an embodiment, the method includes removably coupling a fixture to a first side of the feature of the substrate, the fixture including walls configured to abut sides of the feature and extend beyond a top surface of the feature when the fixture is removably coupled to the first side. The method further includes applying a masking material to the top surface of the feature while the fixture is removably coupled to the first side of the feature. The method further includes removably coupling the fixture to a second side of the feature, the second side opposing the first side, the walls of the fixture configured to abut the sides of the feature and extend beyond a bottom surface of the feature when the fixture is removably coupled to the second side. The method further includes applying the masking material to the bottom surface of the feature while the fixture is removably coupled to the second side of the feature.

In some embodiments, the walls of the fixture extend through apertures of the substrate when the fixture is coupled to the first side of the feature of the substrate.

In some embodiments, the walls of the fixture extend through the apertures of the substrate when the fixture is coupled to the second side of the feature of the substrate.

In some embodiments, the walls of the fixture extend perpendicular to a base of the fixture.

In some embodiments, removably coupling the fixture to the first side of the feature of the substrate includes forming a partial interference fit with the walls of the fixture on the sides of the feature.

In some embodiments, the walls of the fixture includes a first wall and a second wall, wherein the first wall is parallel to the second wall.

In some embodiments, removably coupling the fixture to the first side of the feature of the substrate includes inserting the first wall through a first aperture of the substrate and inserting the second wall through a second aperture of the substrate.

In some embodiments, the masking material is a glue. In some embodiments, applying the masking material to the top surface of the feature includes applying a glue to the top surface of the feature.

Embodiments of a masking system are disclosed. In one embodiment the masking system includes a substrate including a feature that includes a top surface, a bottom surface, and sides. The masking system further includes a fixture including walls configured to abut the sides of the feature and extend beyond the top surface of the feature, wherein the fixture is configured to expose the top surface of the feature for the application of a masking material.

In some embodiments, the substrate further includes a first aperture and a second aperture and wherein the walls include a first wall and a second wall In some embodiments, the first wall is configured to extend through the first aperture and wherein the second wall is configured to extend through the second aperture.

In some embodiments, the first wall of the fixture and the second wall of the fixture extend perpendicular to a base of the fixture.

In some embodiments, the walls of the fixture are configured to form a partial interference fit on the sides of the feature.

Embodiments of a method of masking a feature of a substrate using a fixture are disclosed. In an embodiment, the method includes coupling a fixture to a first side of the feature of the substrate, the fixture including an aperture configured to expose a top surface of the feature and abut sides of the feature when the fixture is coupled to the first side. The method further includes applying a masking material to the top surface of the feature and to a bottom surface opposite the top surface while the fixture is coupled to the first side. The method further includes applying a coating to the substrate and the masking material.

In some embodiments, coupling the fixture to the first side of the feature of the substrate includes forming a partial interference fit of the fixture on the sides of the feature.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which:

FIG. 13A is a perspective view of a substrate during a stage of a masking and de-masking process, according to one or more embodiments of the present disclosure;

FIG. 13B is a perspective view of a substrate during a stage of a masking and de-masking process, according to one or more embodiments of the present disclosure;

FIG. 13C is a perspective view of a substrate during a stage of a masking and de-masking process, according to one or more embodiments of the present disclosure FIG. 13D is a perspective view of a substrate during a stage of a masking and de-masking process, according to one or more embodiments of the present disclosure FIG. 13E is a perspective view of a substrate during a stage of a masking and de-masking process, according to one or more embodiments of the present disclosure.

DETAILED DESCRIPTION

Figure 1:
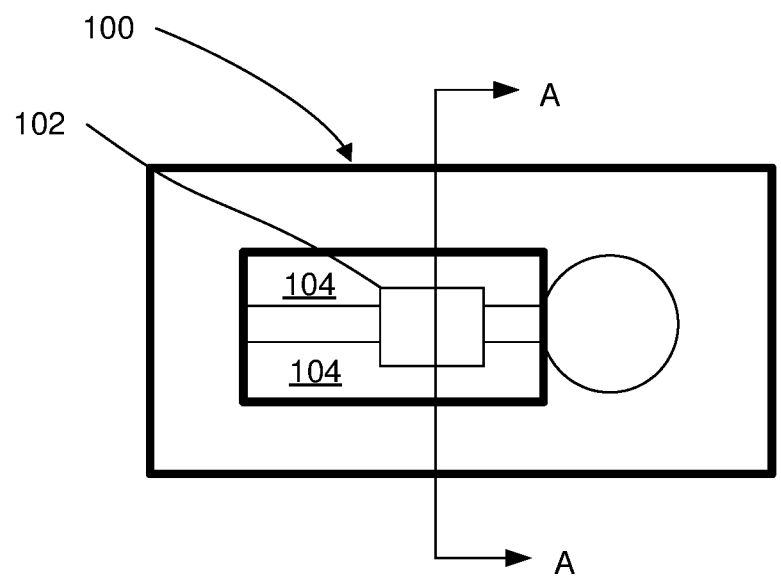
FIG. 1 is a top view of a substrate that includes a feature to be masked, according to one or more embodiments of the present disclosure.

The protection of electronic devices is often a concern to consumers, particularly in view of the cost and extent to which consumers rely on state-of-the-art portable electronic devices. Water and other types of moisture and contamination can damage electronic devices. Protective coatings (or films) may be particularly useful for protecting portable electronic devices, such as cellular telephones, tablet computers, laptop computers, and other electronic devices, from accidental or incidental exposure to moisture. However, subcomponents of devices, such as ports, universal serial bus (USB) ports, proprietary ports, headphone jack receptacles, or other receptacles, openings or recesses may be adversely affected by a protective coating. Accordingly, masking materials may be used to cover subcomponents prior to applying a protective coating. After the protective coating is applied, the subcomponents may be de-masked to remove the making material, resulting in uncoated subcomponents.

Masking and de-masking processes may, in some cases, be time and labor intensive. Repeatability and consistency in such processes are difficult to maintain. In addition, the precise placement of masking material on particular subcomponents may be difficult. For example, precisely placing masking material on subcomponents may be complicated by the surrounding features on a substrate, as well as the location, size, and shape of the subcomponents. The subject matter of the present application has been developed in response to the present state of the art, and in particular, in response to the shortcomings of masking and de-masking processes associated with the application of protective coatings on substrates. Accordingly, the subject matter of the present application has been developed to provide fixtures and sacrificial layers to aid in masking and de-masking processes of electronic components and subcomponents.

Other aspects, as well as features and advantages of various aspects, of the disclosed subject matter will be apparent to those of ordinary skill in the art through consideration of this disclosure and the appended claims.

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings.

FIG. 1 illustrates an embodiment of a substrate 100 that includes a feature 102 to be masked. The substrate 100 may be an electrical device, an industrial device, a vehicular device, a precision mechanical device, a medical device, a scientific instrument, or the like, or a subcomponent of the like. The substrate 100 shown in FIG. 1 includes an aperture 104 where the feature 102 extends across the aperture 104.

Prior to applying a coating onto the substrate 100, a top surface of the feature 102 (see, e.g., FIG. 2) and a bottom surface of the feature 102 (see, e.g., FIG. 3) are to receive a masking material 106. However, applying a masking material 106, such as a glue, on the top and bottom surfaces of the feature 102 may result in the masking material 106 spreading over and onto the sides of the feature 102. If the masking material 106 on the top surface of the feature 102 bleeds into or combines with the masking material 106 on the bottom surface of the feature 102, the masking material 106 will be difficult to remove during a de-masking process because the masking material 106 will effectively envelop the feature 102. De-masking the feature 102 in such a situation, would require the additional steps of cutting, or otherwise severing, the masking material 106 on the top surface of the feature 102 from the masking material 106 on the bottom surface of the feature 102.

Figure 2:
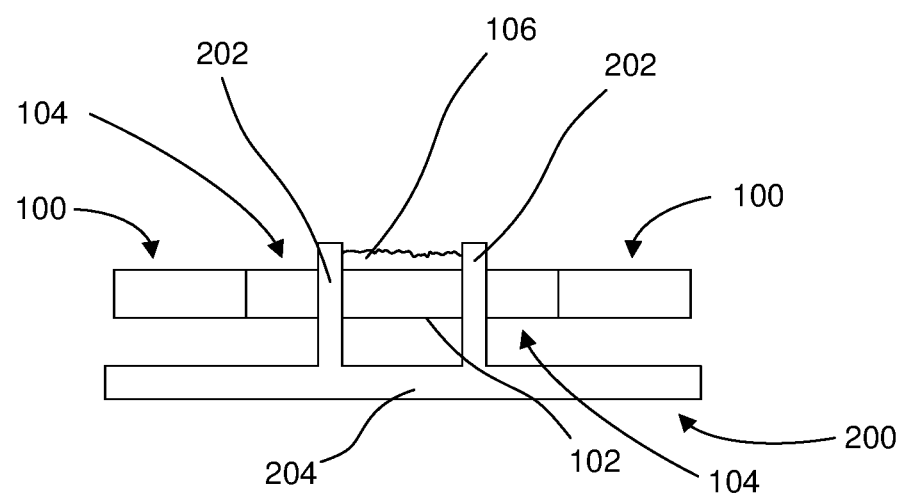
FIG. 2 is a cross-sectional view of the substrate at line A-A of FIG. 1 and includes a fixture, according to one or more embodiments of the present disclosure.

FIG. 2 illustrates a cross-sectional view of the substrate 100 at line A-A of FIG. 1 and includes a cross-sectional view of a fixture 200. The fixture 200 includes walls 202 that extend perpendicular to a base 204 of the fixture. The walls 202 are spaced from each other a distance substantially equal to a width (or other dimension) of the feature 102 of the substrate 100. When supported by the fixture 200, the walls 202 of the fixture 200 extend through the apertures 104 adjacent to the sides of the feature 102. In some embodiments, the walls 202 form a partial interference fit on the sides of the feature 102 to prevent the masking materials 106 from spreading to the sides of the feature 102 from the top surface of the feature 102. In some embodiments, the walls 202 of the fixture 200 are designed to abut the sides of the feature 102. The spacing and shape of the walls 202 may be designed to accommodate the size and shape of the feature 102. With the walls 202 of the fixture 200 engaged with the sides of the feature 102, a masking material 106 may be applied to the top surface of the feature 102.

After applying the masking material 106 to the top surface of the feature 102, the substrate 100 may be flipped over and masking material 106 may be applied to the bottom surface of the feature 102. To facilitate the application of the masking material 106 to the bottom surface of the feature 102, the feature 102 is inserted between the walls 202 of the fixture 200 in the same manner as described above, but with the bottom surface of the feature 102 exposed. The masking material 106 may be applied to the bottom surface of the feature 102 while the walls 202 of the fixture 200 restrict the masking material 106 from extending past the bottom surface of the feature 102 to the side walls of the feature 102.

The resulting masking material 106 on the top and bottom surfaces of the feature 102 are separate and spaced-apart (see, e.g., FIGS. 3 and 4) and thus need not be separated during a subsequent de-masking process, which, for example, may include a cutting step to separate the masking material 106 on the top surface of the feature 102 from the masking material 106 on the bottom surface of the feature 102. The cutting step may be time consuming and labor intensive and, in some cases, may be damaging to the feature 102 if precise cutting is not followed. The separate masking materials 106 on the top surface and the bottom surface of the feature 102 allow for the easy removal of the masking materials 106 from the feature 102 during the subsequent removal process of de-masking.

Figure 3:
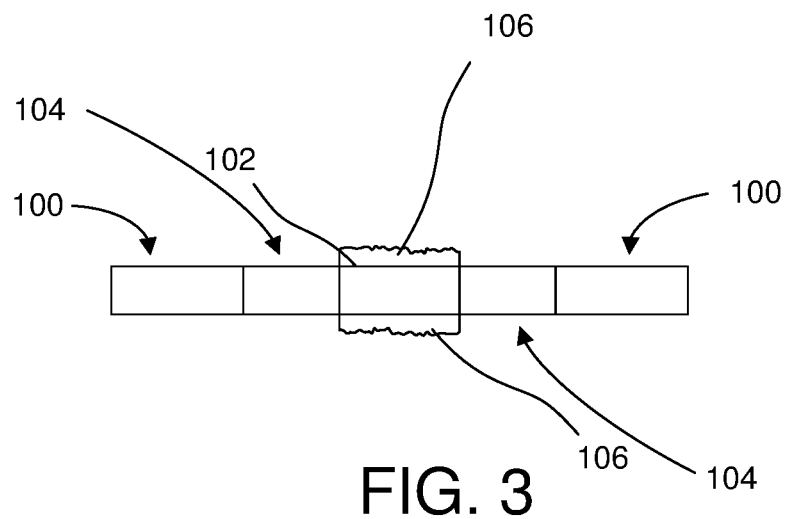
FIG. 3 is a cut-away view of the substrate at line A-A is shown after application of the masking material to the top and bottom surfaces of the feature, according to one or more embodiments of the present disclosure.
Figure 4:
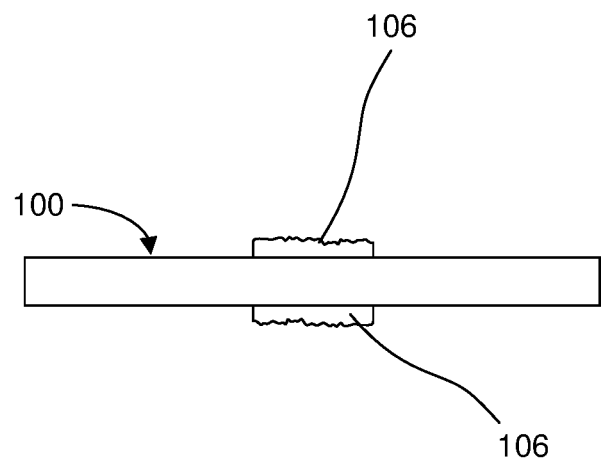
FIG. 4 is a side view of the substrate after application of the masking material to the top and bottom surfaces of the feature, according to one or more embodiments of the present disclosure.

Referring to FIG. 3, a cut-away view of the substrate 100 at line A-A is shown after application of the masking material 106 to the top and bottom surfaces of the feature 102. Referring to FIG. 4, a side view of the substrate 100 is shown after application of the masking material 106 to the top and bottom surfaces of the feature 102.

According to one embodiment of a method of masking a feature of a substrate using a fixture includes removably coupling a fixture to a first side of a feature of a substrate. The fixture includes walls configured to abut sides of the feature and extend beyond a top surface of the feature when the fixture is removably coupled to the first side. The method further includes applying a masking material to the top surface of the feature while the fixture is removably coupled to the first side of the feature. Additionally, the method includes removably coupling the fixture to a second side of the feature, the second side opposing the first side. Furthermore, the method includes applying the masking material to the bottom surface of the feature while the fixture is removably coupled to the second side of the feature. After applying the masking material to the top surface and the bottom surface of the feature, a coating may be applied to the substrate.

Figure 5:
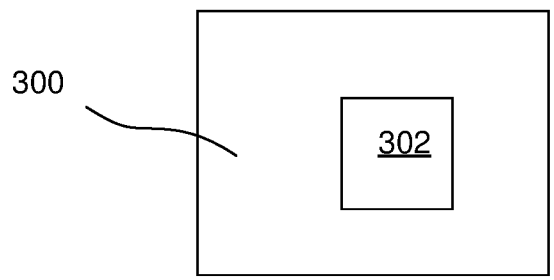
FIG. 5 is a top view of a fixture, according to one or more embodiments of the present disclosure.

Referring to FIG. 5, another embodiment of a fixture 300 is depicted. The fixture 300 includes an aperture 302. The aperture 302 shown in FIG. 5 is rectangular in shape. The shape and size of the aperture 302 may be designed to match the shape and size of the feature 102 of the substrate 100 (see, e.g., FIG. 6).

Figure 6:
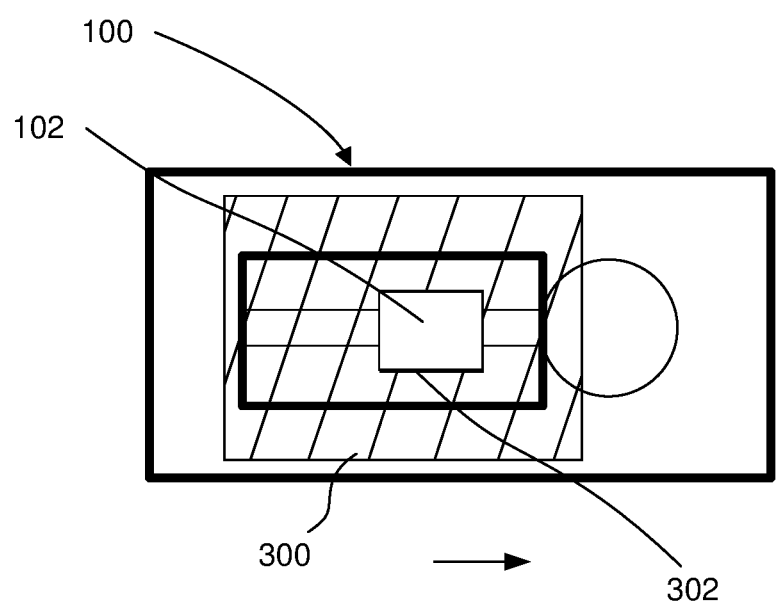
FIG. 6 is a top view the fixture and a substrate with an aperture exposing the top surface of the feature, according to one or more embodiments of the present disclosure.

Referring to FIG. 6, the fixture 300 is coupled to the substrate 100 with the aperture 302 exposing the top surface of the feature 102. Masking material 106 may be applied to the top surface of the feature 102 while the aperture 302 is aligned with the top surface of the feature 102. The fixture 300 restricts the masking material 106 from spreading beyond the top surface of the feature 102 to the sides of the feature 102. The fixture 300 may be a sheet made from paper, metal, plastic, or any of a variety of materials.

The substrate 100 may be flipped over and the fixture 300 placed to expose the bottom surface of the feature 102 through the aperture 302. With the bottom surface of the feature 102 exposed through the aperture 302, masking material 106 may be applied to the bottom surface of the feature 102 in the same manner as described with the top surface of the feature 102. Accordingly, the fixture 300 restricts the masking material 106 from spreading beyond the top surface of the feature 102 to the sides of the feature 102. Masking material 106 will cover the top and bottom surfaces of the feature 102 without extending to the sides of the feature 102 (see, e.g., FIGS. 3 and 4).

According to one embodiment, a method of masking a feature of a substrate using a fixture includes coupling a fixture to a first side of a feature of a substrate. The fixture includes an aperture configured to expose a top surface of the feature and abut sides of the feature when the fixture is coupled to the first side. The method further includes applying a masking material to the top surface of the feature while the fixture is coupled to the first side. Additionally, the method includes applying the masking material to a bottom surface of the feature opposite the top surface while the fixture is coupled to the first side. In some embodiments, the fixture is coupled to a second side of the feature before the masking material is applied to the bottom surface of the feature. After applying the masking material to the top and bottom surfaces of the feature, a coating may be applied to the substrate.

Figure 7:
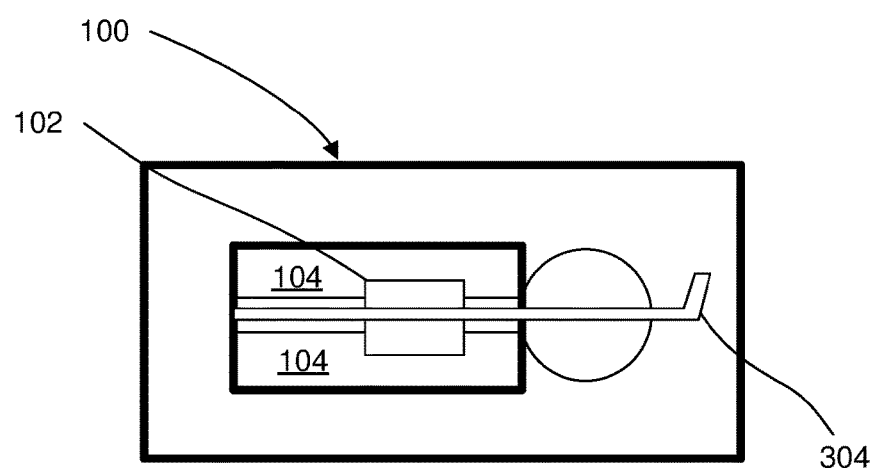
FIG. 7 is a top view of a substrate with a pull-tab, according to one or more embodiments of the present disclosure.

Referring to FIG. 7, the substrate 100 is shown with a pull-tab 304. The pull-tab 304 may be placed on the substrate 100 prior to application of the masking material 106 to aid in the removal of the masking materials 106 after applying the protective coating. The pull-tab 304 is placed over the feature 102 and extends beyond an application area of the masking material 106. During a removal step, the pull-tab 304 may be pulled off the substrate 100, thus removing the masking material 106 from the feature 102.

Figure 8:
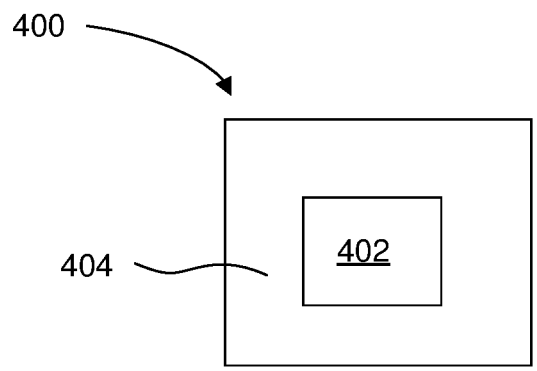
FIG. 8 is a top view of a fixture, according to one or more embodiments of the present disclosure.
Figure 9:
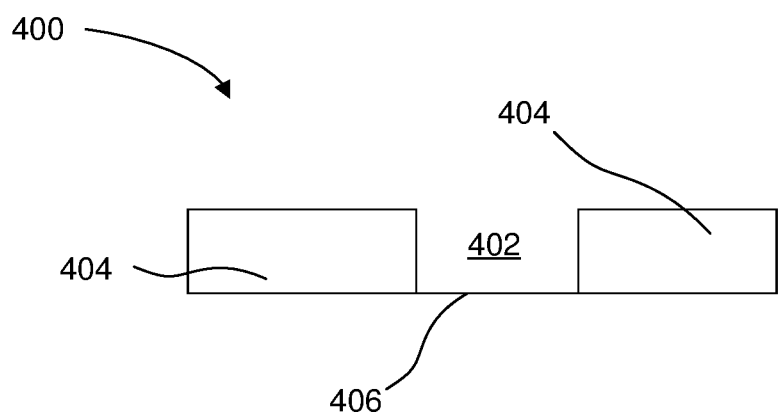
FIG. 9 is a cross-sectional side view of the fixture, according to one or more embodiments of the present disclosure.
Figure 10:
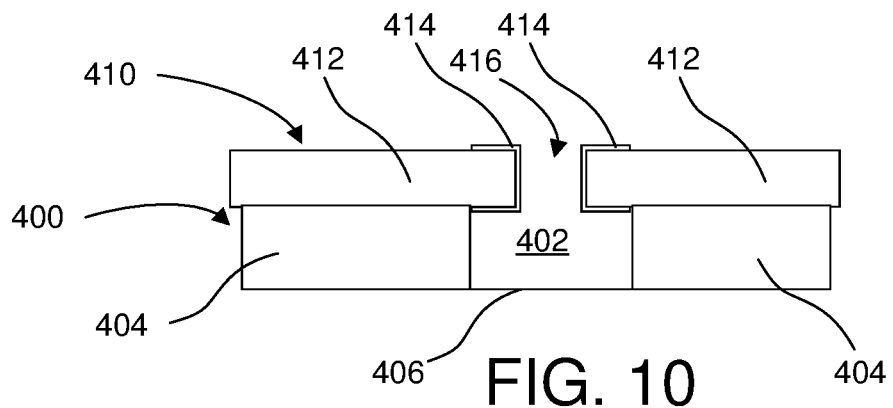
FIG. 10 is a cross-section side view of the fixture and a substrate, according to one or more embodiments of the present disclosure.
Figure 11:
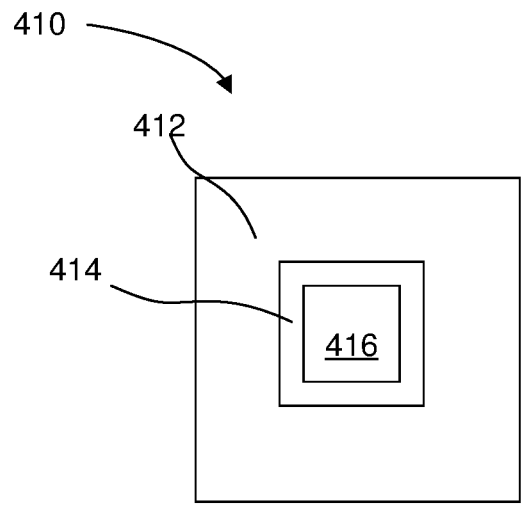
FIG. 11 is a top view of a substrate, according to one or more embodiments of the present disclosure.

Referring to FIGS. 8-12, embodiments of a fixture 400 to aid in a masking process of a substrate 410 are shown. Referring to FIGS. 8 and 9, a top view and a cross-sectional view of the fixture 400 are shown. The fixture 400 includes a bottom sheet 406 and a raised barrier 404 that encloses the sides of a bowl cavity 402. Substrates 410 may include through-holes 416 with features 414 that are difficult to mask (see, e.g., FIGS. 10 and 11). Referring to FIG. 11, a top view of the substrate 410 is shown. The substrate 410 includes a through-hole 416 and a feature 414 that extends around the sides of the through-hole 416 to a portion of the top surface of the substrate 410 and to a portion of the bottom surface of the substrate 410.

Referring to FIG. 10, the substrate 410 may be placed on the fixture 400 such that the feature 414 is directly over the bowl cavity 402 with the feature 414 aligned with the bowl cavity 402. The fixture 400 allows for masking material 422 to be placed on the top surface of the feature 414 and to be inserted through the through-hole 416 into the bowl cavity 402 and be pushed onto the bottom surface of the feature 414. The fixture 400 allows for the application of a masking material 422 to a top surface of the feature 414, through the through-hole 416, and to a bottom surface of the feature 414 without needing to flip over the substrate 410. The size and shape of the bowl cavity 402 may be designed to match or be larger than the size and shape of the feature 414.

Figure 12:
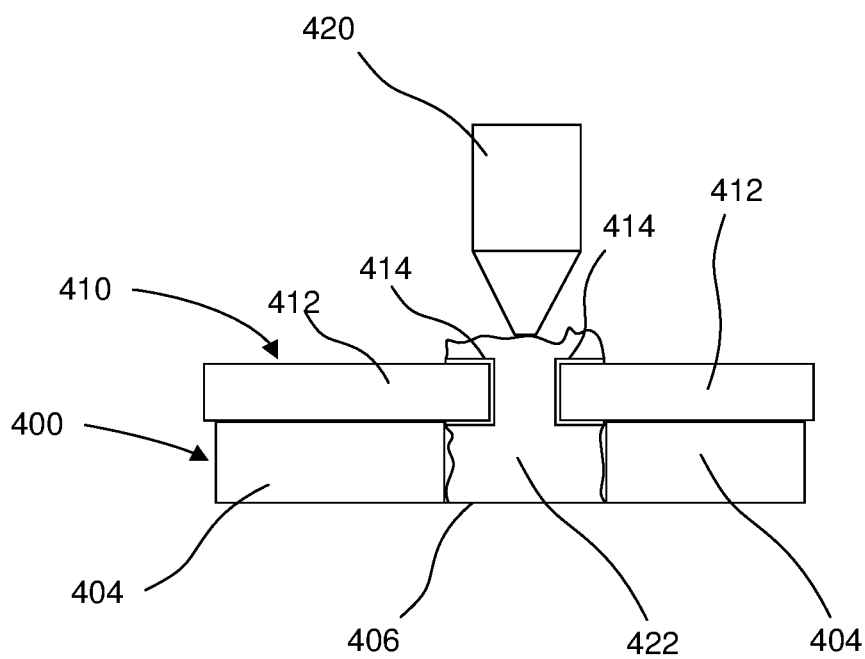
FIG. 12 is a cross sectional side view of a fixture and substrate with a masking material applicator, according to one or more embodiments of the present disclosure.

With the substrate 410 placed on the fixture 400 with the feature 414 aligned with the bowl cavity 402, a masking material applicator 420 (see, e.g., FIG. 12) may apply masking material 422 onto the top surface and through the through-hole 416 into the bowl cavity 402. The bottom sheet 406 and the raised barriers 404 trap the masking material 422 to force the masking material 422 to apply to the bottom surface of the feature 414, the sides of the feature 414, and the top surface of the feature 414 as shown in FIG. 12. The fixture 400 allows for the masking material 422 to be applied to the top surface, the bottom surface, and the side surface of the feature 414, while eliminating a time consuming and labor intensive step of flipping over the substrate 410.

In one embodiment, a method of masking a feature (such as feature 414) of a substrate 410 with a through-hole includes providing a fixture that includes a bowl cavity below the substrate. The substrate can include a through-hole and a feature extending through the through-hole and onto a portion of a top surface of the substrate and a portion of a bottom surface of the substrate. The method further includes directing a masking material through the through-hole into the bowl cavity to coat a top surface, a bottom surface, and a side surface of the feature with the masking material without flipping over the substrate.

Referring to FIG. 13A-13E, an embodiment of sacrificial layers for use in a masking and de-masking process is shown. As shown in FIG. 13A, a substrate 500 includes contact areas 502 that need to be masked prior to the application of a protective coating. As shown in FIG. 13B, sacrificial layers 504 are placed over the contact areas 502 and adhere to the contact areas 502. The sacrificial layers 504 are designed to be the approximate size and shape of the contact areas 502. The sacrificial layers 504 may be any of a variety of materials including epoxies or polymers. Referring to FIG. 13C, a protective coating is applied to the substrate 500 after which laser rastering from a laser beam is applied to the sacrificial layers 504, as shown in FIG. 13D. The laser beam heats up the sacrificial layers 504 causing, in some cases, the sacrificial layers 504 to expand and pop-up or de-bond from the substrate 500. In some embodiments, the wavelength of the laser beam may be matched to the particular material or material properties of the sacrificial layers 504. Finally, referring to FIG. 13E, once the sacrificial layers 504 have de-bonded from the substrate 500, the sacrificial layers 504 may be removed from the substrate 500 through a de-masking process. In some cases, the sacrificial layers 504 may be blown off the substrate 500 or, in other cases, physically removed by a manual or automated process.

In one embodiment, a method for masking and de-masking a contact area of a substrate includes bonding a sacrificial layer (such as sacrificial layer 504) to the contact area of the substrate. The method includes applying a coating to the substrate and sacrificial layer. Additionally, the method includes laser rastering the sacrificial layer to de-bond the sacrificial layer from the contact area, and finally, removing the sacrificial layer from the substrate.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

Reference throughout this specification to features, advantages, or similar language does not imply that all of the features and advantages that may be realized with the subject matter of the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The present subject matter may be embodied in other specific forms without departing from its spirit or essential characteristics. The described embodiments are to be considered in all respects only as illustrative and not restrictive.

What is claimed:

1. A method of masking a feature of a substrate using a fixture, comprising:
    removably coupling a fixture to a first side of the feature of the substrate, the fixture comprising walls configured to abut sides of the feature and extend beyond a top surface of the feature when the fixture is removably coupled to the first side, wherein the walls of the fixture extend through apertures of the substrate when the fixture is coupled to the first side of the feature of the substrate;
    applying a masking material to the top surface of the feature while the fixture is removably coupled to the first side of the feature;
    removably coupling the fixture to a second side of the feature, the second side opposing the first side, the walls of the fixture configured to abut the sides of the feature and extend beyond a bottom surface of the feature when the fixture is removably coupled to the second side; and
    applying the masking material to the bottom surface of the feature while the fixture is removably coupled to the second side of the feature.

2. The method of claim 1, wherein the walls of the fixture extend through the apertures of the substrate when the fixture is coupled to the second side of the feature of the substrate.

3. The method of claim 2, wherein the walls of the fixture extend perpendicular to a base of the fixture.

4. The method of claim 3, wherein removably coupling the fixture to the first side of the feature of the substrate comprises forming a partial interference fit with the walls of the fixture on the sides of the feature.

5. The method of claim 1, wherein the walls of the fixture comprises a first wall and a second wall, wherein the first wall is parallel to the second wall.

6. The method of claim 5, wherein removably coupling the fixture to the first side of the feature of the substrate comprises inserting the first wall through a first aperture of the substrate and inserting the second wall through a second aperture of the substrate.

7. The method of claim 1, wherein applying the masking material to the top surface of the feature comprises applying a glue to the top surface of the feature.

8. A method of masking a feature of a substrate using a fixture, comprising:
    removably coupling a fixture to a first side of the feature of the substrate, the fixture comprising walls configured to abut sides of the feature and extend beyond a top surface of the feature when the fixture is removably coupled to the first side, wherein the walls of the fixture comprise a first wall and a second wall, wherein the first wall is parallel to the second wall, wherein removably coupling the fixture to the first side of the feature of the substrate comprises inserting the first wall through a first aperture of the substrate and inserting the second wall through a second aperture of the substrate;
    applying a masking material to the top surface of the feature while the fixture is removably coupled to the first side of the feature;
    removably coupling the fixture to a second side of the feature, the second side opposing the first side, the walls of the fixture configured to abut the sides of the feature and extend beyond a bottom surface of the feature when the fixture is removably coupled to the second side; and
    applying the masking material to the bottom surface of the feature while the fixture is removably coupled to the second side of the feature.

9. The method of claim 8, wherein the walls of the fixture extend through apertures of the substrate when the fixture is coupled to the first side of the feature of the substrate.

10. The method of claim 9, wherein the walls of the fixture extend through the apertures of the substrate when the fixture is coupled to the second side of the feature of the substrate.

11. The method of claim 8, wherein removably coupling the fixture to the first side of the feature of the substrate comprises forming a partial interference fit with the walls of the fixture on the sides of the feature.

12. A method of masking a feature of a substrate using a fixture, comprising:
    removably coupling a fixture to a first side of the feature of the substrate, the fixture comprising walls configured to abut sides of the feature and extend beyond a top surface of the feature when the fixture is removably coupled to the first side, wherein the walls of the fixture extend through apertures of the substrate when the fixture is coupled to the first side of the feature of the substrate; and
    applying a masking material to the top surface of the feature while the fixture is removably coupled to the first side of the feature.

13. The method of claim 12, wherein removably coupling the fixture to the first side of the feature of the substrate comprises forming a partial interference fit with the walls of the fixture on the sides of the feature.

14. The method of claim 12, wherein the walls of the fixture extend through the apertures of the substrate when the fixture is coupled to the second side of the feature of the substrate.

15. The method of claim 12, wherein the walls of the fixture comprises a first wall and a second wall, wherein the first wall is parallel to the second wall.

16. The method of claim 12, wherein removably coupling the fixture to the first side of the feature of the substrate comprises inserting the first wall through a first aperture of the substrate and inserting the second wall through a second aperture of the substrate.

17. The method of claim 12, wherein applying the masking material to the top surface of the feature comprises applying a glue to the top surface of the feature.

\* \* \* \* \*